US008658515B2

(12) United States Patent
Inoue et al.

(10) Patent No.: US 8,658,515 B2
(45) Date of Patent: Feb. 25, 2014

(54) METHOD OF MANUFACTURING FILM FOR SEMICONDUCTOR DEVICE

(75) Inventors: Koichi Inoue, Ibaraki (JP); Miki Morita, Ibaraki (JP); Yuichiro Shishido, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 156 days.

(21) Appl. No.: 13/415,073

(22) Filed: Mar. 8, 2012

(65) Prior Publication Data

US 2012/0231557 A1 Sep. 13, 2012

(30) Foreign Application Priority Data

Mar. 10, 2011 (JP) .................................. 2011-052973

(51) Int. Cl.
*H01L 21/00* (2006.01)

(52) U.S. Cl.
USPC ............ 438/464; 438/114; 438/460; 438/465

(58) Field of Classification Search
USPC .................. 438/114, 460, 464, 465
See application file for complete search history.

(56) References Cited

U.S. PATENT DOCUMENTS

| 4,961,804 | A |   | 10/1990 | Aurichio |
|---|---|---|---|---|
| 2010/0193969 | A1 | * | 8/2010 | Takamoto ..................... 257/778 |
| 2010/0236689 | A1 | * | 9/2010 | Amano et al. .................. 156/64 |
| 2010/0301497 | A1 |   | 12/2010 | Misumi et al. |
| 2011/0151207 | A1 |   | 6/2011 | Hong et al. |
| 2012/0231236 | A1 | * | 9/2012 | Shishido et al. ........... 428/195.1 |

FOREIGN PATENT DOCUMENTS

| JP | 60-057642 A | 4/1985 |
|---|---|---|
| JP | 2003-197651 | 7/2003 |
| JP | 2004-142430 | 5/2004 |
| JP | 2007-305680 | 11/2007 |
| JP | 2008-021858 | 1/2008 |
| JP | 2008-108828 | 5/2008 |
| JP | 2011-111530 | 10/2010 |
| JP | 2011-009711 | 1/2011 |
| JP | 2010-245191 | 6/2011 |
| KR | 10-2011-0007021 | 1/2011 |

OTHER PUBLICATIONS

Notification of Reasons for Refusal dated Mar. 13, 2012 in corresponding Japanese patent application No. 2011-052973.
Prior Art Search (for Expedited Examination) in corresponding Korean patent application No. 10-2012-0024288, filed on Mar. 9, 2012.
Notice of Allowance with cited references issued by the Korean Intellectual Property Office in corresponding patent application No. 10-2012-0024288, dated May 2, 2012.

* cited by examiner

*Primary Examiner* — Bac Au
(74) *Attorney, Agent, or Firm* — Knobbe, Martens, Olson & Bear LLP

(57) ABSTRACT

The present invention aims to provides a method of manufacturing a film for a semiconductor device in which a dicing film, a die bond film, and a protecting film are laminated in this order, including the steps of: irradiating the die bond film with a light ray having a wavelength of 400 to 800 nm to detect the position of the die bond film based on the obtained light transmittance and punching the dicing film out based on the detected position of the die bond film, and in which T2/T1 is 0.04 or more, wherein T1 is the light transmittance of the portion where the dicing film and the protecting film are laminated and T2 is the light transmittance of the portion where the dicing film, the die bond film, and the protecting film are laminated.

7 Claims, 2 Drawing Sheets

METHOD OF MANUFACTURING FILM FOR SEMICONDUCTOR DEVICE

This application claims priority to Japanese Patent Application No. 2011-052973, filed Mar. 10, 2011. The above-referenced application is hereby expressly incorporated by reference in its entirety.

BACKGROUND OF THE INVENTION

1. Field of the Invention

The present invention relates to a method of manufacturing a film for a semiconductor device.

2. Description of the Related Art

Conventionally, a semiconductor wafer is manufactured to have a large area in advance, diced into chips (separation by cutting), and transferred to an expanding step. A dicing film is used to fix the semiconductor wafer when dicing.

The semiconductor wafer that is fixed to the dicing film is diced into chips, and expanded uniformly in the surface direction on an expansion ring to separate each chip, and then the chips are picked up.

A dicing film has been conventionally proposed in Japanese Patent Application Laid-Open No. 60-57642, that adheres and holds a semiconductor wafer in a dicing step and also yields a die bond film for fixing a chip that is necessary in a mounting step.

The dicing film with a die bond film as described above can be obtained by, for example, (1) producing a die bond film and punching the film into the shape of the semiconductor wafer to which the film is to be pasted, (2) laminating the punched die bond films on the dicing film at prescribed intervals, (3) pasting the laminate to a protecting film with the die bond film side being a pasting surface, and (4) punching the dicing film out so that the die bond film comes to the center and peeling the protecting film. Alternatively, the dicing film with a die bond film can be obtained by (1) producing a die bond film and punching the film into the shape of the semiconductor wafer to which the film is to be pasted, (2) laminating the punched die bond films on the dicing film at prescribed intervals, (3) punching the dicing film out so that the die bond film comes to the center. The reason why the dicing film is punched out so that the die bond film comes to the center is that a dicing ring is normally used by being pasted to the periphery of the dicing film and the dicing ring is contaminated when the dicing ring contacts with the die bond film. Another reason is that the wafer and the die bond film are pasted to each other with a shift in position if the die bond film is not located at the center of the dicing ring film in the wafer mounting step.

SUMMARY OF THE INVENTION

There is a case where a die bond film cannot be punched out accurately so that the die bond film comes to the center in a conventional manufacturing method, and there has been a problem that such a case causes a decrease of manufacturing yield of the dicing film with a die bond film.

The present invention has been made in view of the above-described problems, and an object thereof is to provide a method of manufacturing a film for a semiconductor device in which the die bond film is located at the center of the dicing film and to provide the film for a semiconductor device.

The present inventors investigated a method of manufacturing a film for a semiconductor device, and a film for a semiconductor device to solve the above-described conventional problems. As a result, they found that a method of manufacturing a film for a semiconductor device in which the die bond film is located at the center of the dicing film and the film for a semiconductor device can be provided by adopting the following configuration, and completed the present invention.

The method of manufacturing a film for a semiconductor device according to the present invention is a method of manufacturing a film for a semiconductor device in which a dicing film, a die bond film, and a protecting film are laminated in this order, and includes the steps of: producing the dicing film, producing a die bond film, punching the die bond film into the shape of the semiconductor wafer to which the film is to be pasted, pasting the plurality of die bond films to the dicing film at prescribed intervals and further pasting the protecting film with the die bond film side being a pasting surface, irradiating the die bond film with a light ray having a wavelength of 400 to 800 nm to detect the position of the die bond film based on the obtained light transmittance, and punching the dicing film out based on the detected position of the die bond film. In this method, T shown in the following formula (A) is 4 or more, wherein T1 is the light transmittance at a wavelength of 400 to 800 nm of the portion where the dicing film and the protecting film are laminated and T2 is the light transmittance at a wavelength of 400 to 800 nm of the portion where the dicing film, the die bond film, and the protecting film are laminated.

$$T=100-((T2/T1)\times 100) \qquad \text{Formula (A)}$$

According to the above-described configuration, with the step of producing the dicing film, the step of producing a die bond film, the step of punching the die bond film into the shape of the semiconductor wafer to which the film is to be pasted, and the step of pasting the plurality of die bond films to the dicing film at prescribed intervals and further pasting the protecting film thereto with the die bond film side being a pasting surface, the plurality of die bond films are pasted at prescribed intervals between one continuous dicing film and one continuous protecting film.

Next, the die bond film is irradiated with a light ray having a wavelength of 400 to 800 nm to detect the position of the die bond film based on the obtained light transmittance. Specifically, when the light transmittance changes to a certain extent or more such that the light transmittance changes from the light transmittance T1 to the light transmittance T2 and T shown in the formula (A) is 4 or more for example, the position where the light transmittance changes is detected to be one end of the die bond film. Then, the dicing film is punched out based on the detected position of the die bond film. Because the step of punching the dicing film out is performed based on the position of the die bond film, the die bond film can be positioned at the center of each dicing film to be punched out.

According to the above-described configuration, a film for a semiconductor device can be manufactured in which the die bond film is located at the center of the dicing film.

In the above-described configuration, the light transmittance T1 is preferably 2 to 80%.

In the above-described configuration, the light transmittance T2 is preferably 0.1 to 70%.

DESCRIPTION OF THE REFERENCE NUMERALS

| | |
|---|---|
| 1 | BASE |
| 2 | PRESSURE-SENSITIVE ADHESIVE LAYER |
| 3 | DIE BOND FILM |
| 4 | SEMICONDUCTOR WAFER |
| 5 | SEMICONDUCTOR CHIP |
| 6 | ADHEREND |
| 7 | BONDING WIRE |
| 8 | SEALING RESIN |
| 10 | FILM FOR SEMICONDUCTOR DEVICE |
| 11 | DICING FILM |
| 14 | PROTECTING FILM |
| 15 | FILM FOR SEMICONDUCTOR DEVICE BEFORE PRECUT |

DESCRIPTION OF THE PREFERRED EMBODIMENTS (Film for Semiconductor Device)

Figure 1:
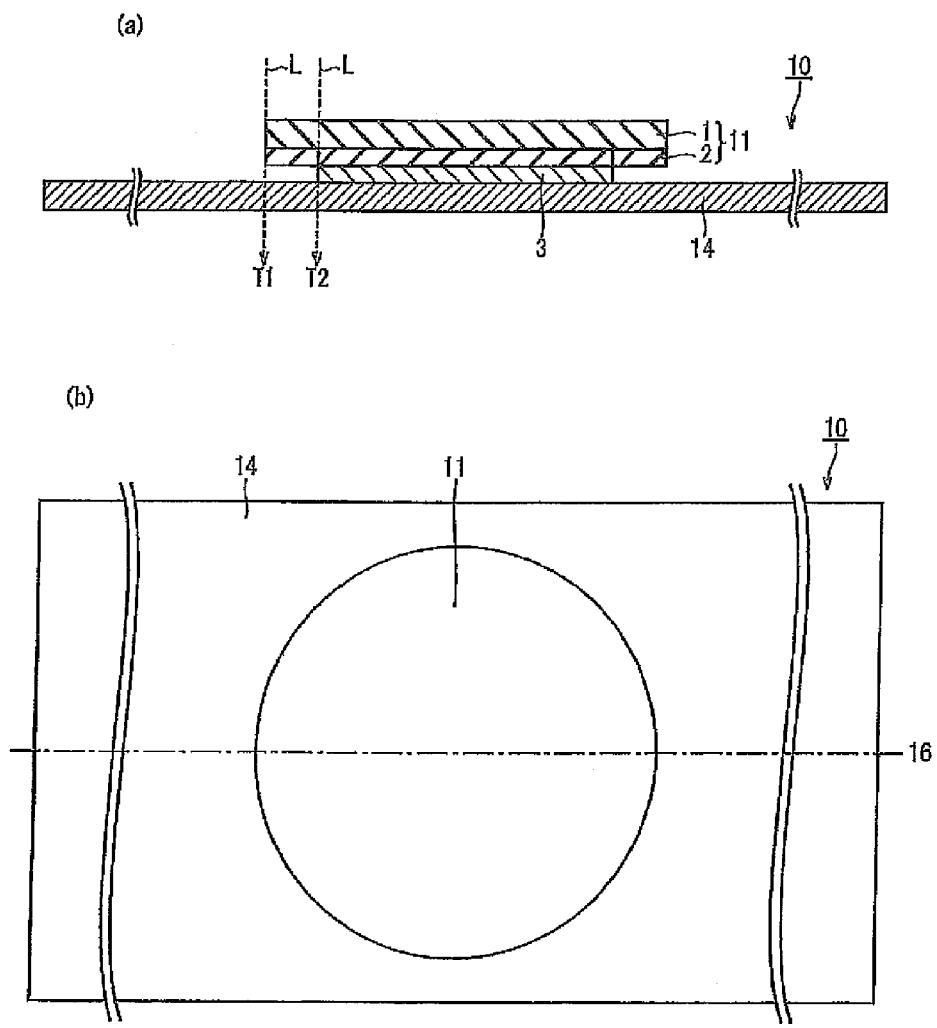
FIG. 1A is a schematic cross-sectional view showing the film for a semiconductor device according to one embodiment of the present invention.
FIG. 1B is a plan view showing the same.
Figure 2:
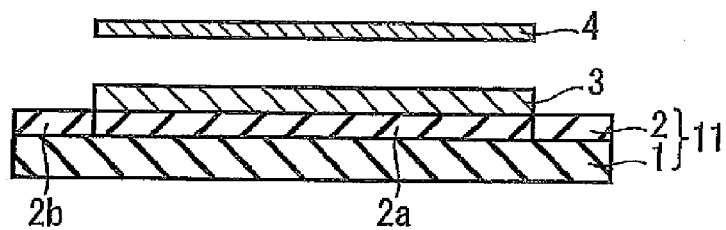
FIG. 2 is a schematic cross-sectional view showing part of the film for a semiconductor device shown in FIGS. 1A and 1B.

A film for a semiconductor device according to one embodiment of the present invention is explained below. FIG. 1A is a schematic cross section view showing a film for a semiconductor device according to one embodiment of the present invention. FIG. 1B is a plan view showing the same. FIG. 2 is a schematic cross section view showing a part of the film for a semiconductor device of FIGS. 1A and 1B.

As shown in FIGS. 1A and 1B, a film for a semiconductor device 10 has a configuration in which a dicing film 11 that is circular in plan view is laminated on a long protecting film 14. The dicing film 11 is configured by laminating a pressure-sensitive adhesive layer 2 on a base 1, and a die bond film 3 having a smaller diameter than that of the dicing film 11 is laminated on the pressure-sensitive adhesive layer 2. The dicing film 11 is laminated on the protecting film 14 so as to face the pressure-sensitive adhesive layer 2 and the die bond film 3. In the present invention, the die bond film is not necessary to be laminated.

Assuming that the light transmittance at a wavelength of 400 to 800 nm of the portion where the dicing film 11 and the protecting film 14 are laminated is T1 and the light transmittance at a wavelength of 400 to 800 nm of the portion where the dicing film 11, the die bond film 3, and the protecting film 14 are laminated is T2, T is shown in the following formula (A) is 4 or more. T is preferably 10 or more. The larger T is, the more preferable. However, T can be 50 or less or 30 or less.

$$T=100-((T2/T1)\times 100) \quad \text{Formula (A)}$$

The manufacturing method of the film 10 for a semiconductor device is explained in detail below. First, the plurality of die bond films 3 punched into the shape of the semiconductor wafer to which they are to be pasted are pasted to the dicing film 11 at prescribed intervals, and further pasted to the protecting film 14 with the die bond film 3 side being a pasting surface. With this operation, the plurality of die bond films 3 are pasted at prescribed intervals between one continuous dicing film 11 and one continuous protecting film 14. Next, the die bond film 3 is irradiated with a light ray having a wavelength of 400 to 800 nm to detect the position of the die bond film 3 based on the obtained light transmittance. Specifically, when the light transmittance changes to a certain extent or more such that the light transmittance changes from the light transmittance T1 to the light transmittance T2, and T shown in the formula (A) is 4 or more for example, the position where the light transmittance changes is detected to be one end of the die bond film 3. Then, the dicing film 11 is punched out based on the detected position of the die bond film 3. Because the step of punching the dicing film 11 out is performed based on the position of the die bond film 3, the die bond film 3 can be positioned at the center of each dicing film 11 to be punched out. The film 10 for a semiconductor device is manufactured by the above-described manufacturing method, and because T is 4 or more, the die bond film 3 is located at the center of the dicing film 11.

The light transmittance T1 is preferably 2 to 80%, more preferably 2 to 50%, further preferably 2 to 20%, and especially preferably 2 to 10%. When the light transmittance T1 is 2 to 80%, T can be easily made 4 or more.

The light transmittance T2 is preferably 0.1 to 70%, more preferably 0.1 to 40%, and further preferably 0.1 to 10%. When the light transmittance T2 is 0.1 to 70%, T can be easily made 4 or more.

The base 1 preferably has ultraviolet ray transparency, and is one which serves as a strength base of the dicing film 11. Examples thereof include polyolefin such as low-density polyethylene, straight chain polyethylene, intermediate-density polyethylene, high-density polyethylene, very low-density polyethylene, random copolymer polypropylene, block copolymer polypropylene, homopolypropylene, polybutene, and polymethylpentene; an ethylene-vinylacetate copolymer; an ionomer resin; an ethylene(meth)acrylic acid copolymer; an ethylene(meth)acrylic acid ester (random or alternating) copolymer; an ethylene-butene copolymer; an ethylene-hexene copolymer; polyurethane; polyester such as polyethyleneterephthalate and polyethylenenaphthalate; polycarbonate; polyetheretherketone; polyimide; polyetherimide; polyamide; whole aromatic polyamides; polyphenylsulfide; aramid (paper); glass; glass cloth; a fluorine resin; polyvinyl chloride; polyvinylidene chloride; a cellulose resin; a silicone resin; metal (foil); and paper.

Further, the material of the base 1 includes a polymer such as a cross-linked body of the above resins. The above plastic film may be also used unstreched, or may be also used on which a monoaxial or a biaxial stretching treatment is performed depending on necessity. According to resin sheets in which heat shrinkable properties are given by the stretching treatment, etc., the adhesive area of the pressure-sensitive adhesive layer 2 and the die bond film 3 is reduced by thermally shrinking the base 1 after dicing, and the recovery of the semiconductor chips (a semiconductor element) can be facilitated.

A known surface treatment such as a chemical or physical treatment such as a chromic acid treatment, ozone exposure, flame exposure, high voltage electric exposure, and an ionized radiation treatment, and a coating treatment by an undercoating agent (for example, a tacky substance described later) can be performed on the surface of the base 1 in order to improve adhesiveness, holding properties, etc. with the adjacent layer. The same type or different type of base material can be appropriately selected and used as the base 1, and a base material in which a plurality of types are blended can be used depending on necessity.

The thickness of the base 1 is preferably 20 μm or more and 200 μm or less, more preferably 40 μm or more and 180 μm or less, and further preferably 60 μm or more and 170 μm or less. By making the thickness of the base 1 20 μm or more and 200 μm or less, the light transmittance of the dicing film can be controlled.

The pressure-sensitive adhesive that is used for forming the pressure-sensitive adhesive layer 2 is not especially limited, and general pressure-sensitive adhesives such as an acrylic pressure-sensitive adhesive and a rubber pressure-sensitive adhesive can be used, for example. The pressure-sensitive adhesive is preferably an acrylic pressure-sensitive adhesive containing an acrylic polymer as a base polymer in view of clean washing of electronic components such as a semiconductor wafer and glass, which are easily damaged by contamination, with ultrapure water or an organic solvent such as alcohol.

Specific examples of the acryl polymers include an acryl polymer in which acrylate is used as a main monomer component. Examples of the acrylate include alkyl acrylate (for example, a straight chain or branched chain alkyl ester having 1 to 30 carbon atoms, and particularly 4 to 18 carbon atoms in the alkyl group such as methylester, ethylester, propylester, isopropylester, butylester, isobutylester, sec-butylester, t-butylester, pentylester, isopentylester, hexylester, heptylester, octylester, 2-ethylhexylester, isooctylester, nonylester, decylester, isodecylester, undecylester, dodecylester, tridecylester, tetradecylester, hexadecylester, octadecylester, and eicosylester) and cycloalkyl acrylate (for example, cyclopentylester, cyclohexylester, etc.). These monomers may be used alone or two or more types may be used in combination. All of the words including "(meth)" in connection with the present invention have an equivalent meaning.

The acrylic polymer may optionally contain a unit corresponding to a different monomer component copolymerizable with the above-mentioned alkyl ester of (meth)acrylic acid or cycloalkyl ester thereof in order to improve the cohesive force, heat resistance or some other property of the polymer. Examples of such a monomer component include carboxyl-containing monomers such as acrylic acid, methacrylic acid, carboxyethyl (meth)acrylate, carboxypentyl (meth) acrylate, itaconic acid, maleic acid, fumaric acid, and crotonic acid; acid anhydride monomers such as maleic anhydride, and itaconic anhydride; hydroxyl-containing monomers such as 2-hydroxyethyl (meth)acrylate, 2-hydroxypropyl (meth)acrylate, 4-hydroxybutyl (meth)acrylate, 6-hydroxyhexyl (meth)acrylate, 8-hydroxyoctyl (meth)acrylate, 10-hydroxydecyl (meth)acrylate, 12-hydroxylauryl (meth)acrylate, and (4-hydroxylmethylcyclohexyl)methyl (meth)acrylate; sulfonic acid group containing monomers such as styrenesulfonic acid, allylsulfonic acid, 2-(meth)acrylamide-2-methylpropanesulfonic acid, (meth) acrylamidepropanesulfonic acid, sulfopropyl (meth)acrylate, and (meth)acryloyloxynaphthalenesulfonic acid; phosphoric acid group containing monomers such as 2-hydroxyethylacryloyl phosphate; acrylamide; and acrylonitrile. These copolymerizable monomer components may be used alone or in combination of two or more thereof. The amount of the copolymerizable monomer(s) to be used is preferably 40% or less by weight of all the monomer components.

For crosslinking, the acrylic polymer can also contain multifunctional monomers if necessary as the copolymerizable monomer component. Such multifunctional monomers include hexane diol di(meth)acrylate, (poly)ethylene glycol di(meth)acrylate, (poly) propylene glycol di(meth)acrylate, neopentyl glycol di(meth)acrylate, pentaerythritol di(meth) acrylate, trimethylol propane tri(meth)acrylate, pentaerythritol tri(meth)acrylate, dipentaerythritol hexa(meth)acrylate, epoxy (meth)acrylate, polyester (meth)acrylate, urethane (meth)acrylate etc. These multifunctional monomers can also be used as a mixture of one or more thereof. From the viewpoint of adhesiveness etc., the use amount of the multifunctional monomer is preferably 30 wt % or less based on the whole monomer components.

Preparation of the above acryl polymer can be performed by applying an appropriate manner such as a solution polymerization manner, an emulsion polymerization manner, a bulk polymerization manner, and a suspension polymerization manner to a mixture of one or two or more kinds of component monomers for example. Since the pressure-sensitive adhesive layer preferably has a composition in which the content of low molecular weight materials is suppressed from the viewpoint of prevention of wafer contamination, and since those in which an acryl polymer having a weight average molecular weight of 300000 or more, particularly 400000 to 3000000 is as a main component are preferable from such viewpoint, the pressure-sensitive adhesive can be made to be an appropriate cross-linking type with an internal cross-linking manner, an external cross-linking manner, etc.

To increase the number-average molecular weight of the base polymer such as acrylic polymer etc., an external crosslinking agent can be suitably adopted in the pressure-sensitive adhesive. The external crosslinking method is specifically a reaction method that involves adding and reacting a crosslinking agent such as a polyisocyanate compound, epoxy compound, aziridine compound, melamine crosslinking agent, urea resin, anhydrous compound, polyamine, carboxyl group-containing polymer. When the external crosslinking agent is used, the amount of the crosslinking agent to be used is determined suitably depending on balance with the base polymer to be crosslinked and applications thereof as the pressure-sensitive adhesive. Generally, the crosslinking agent is preferably incorporated in an amount of about 5 parts by weight or less based on 100 parts by weight of the base polymer. The lower limit of the crosslinking agent is preferably 0.1 parts by weight or more. The pressure-sensitive adhesive may be blended not only with the components described above but also with a wide variety of conventionally known additives such as a tackifier, and aging inhibitor, if necessary.

The pressure-sensitive adhesive layer 2 can be formed from a radiation curing type pressure-sensitive adhesive. The adhesive power of the radiation curing type pressure-sensitive adhesive can be easily decreased by increasing the degree of crosslinking by irradiation with radiation such as an ultraviolet ray, and a difference in the adhesive power of one portion 2a from a different portion 2b can be provided by irradiating only the portion 2a that corresponds to the workpiece pasting portion of the pressure-sensitive adhesive layer 2 shown in FIG. 2.

The portion 2a in which the adhesive power is remarkably decreased can be easily formed by curing the radiation curing type pressure-sensitive adhesive layer 2 in conformity with the die bond film 3 shown in FIG. 2. Because the die bond film 3 is pasted to the portion 2a that is cured and has decreased adhesive power, the interface between the portion 2a of the pressure-sensitive adhesive layer 2 and the die bond film 3 has a property of easily peeling during pickup. On the other hand, the portion that is not irradiated with radiation has a sufficient adhesive power, and forms the portion 2b. A wafer ring can be fixed to the portion 2b.

An radiation curing type pressure-sensitive adhesive having an radiation curing type functional group such as a carbon-carbon double bond and exhibiting adherability can be used without special limitation. An example of the radiation curing type pressure-sensitive adhesive is an adding type radiation curing type pressure-sensitive adhesive in which radiation curing type monomer and oligomer components are compounded into a general pressure-sensitive adhesive such as an acrylic pressure-sensitive adhesive or a rubber pressure-sensitive adhesive.

Examples of the radiation curing type monomer component to be compounded include such as an urethane oligomer, urethane (meth)acrylate, trimethylolpropane tri(meth)acrylate, tetramethylolmethane tetra(meth)acrylate, pentaerythritol tri(meth)acrylate, pentaerythritol tetra(meth)acrylate, dipentaerythritol monohydroxypenta(meth)acrylate, dipentaerythritol hexa(meth)acrylate, and 1,4-butane diol di(meth)acrylate. Further, the radiation curing type oligomer component includes various types of oligomers such as an urethane based, a polyether based, a polyester based, a polycarbonate based, and a polybutadiene based oligomer, and its molecular weight is appropriately in a range of about 100 to 30,000. The compounding amount of the radiation curing type monomer component and the oligomer component can be appropriately determined to an amount in which the adhesive strength of the pressure-sensitive adhesive layer can be decreased depending on the type of the pressure-sensitive adhesive layer. Generally, it is for example 5 to 500 parts by weight, and preferably about 40 to 150 parts by weight based on 100 parts by weight of the base polymer such as an acryl polymer constituting the pressure sensitive adhesive.

Further, besides the added type radiation curing type pressure sensitive adhesive described above, the radiation curing type pressure sensitive adhesive includes an internal radiation curing type pressure sensitive adhesive using an acryl polymer having a radical reactive carbon-carbon double bond in the polymer side chain, in the main chain, or at the end of the main chain as the base polymer. The internal radiation curing type pressure sensitive adhesives of an internally provided type are preferable because they do not have to contain the oligomer component, etc. that is a low molecular weight component, or most of them do not contain, they can form a pressure-sensitive adhesive layer having a stable layer structure without migrating the oligomer component, etc. in the pressure sensitive adhesive over time.

The above-mentioned base polymer, which has a carbon-carbon double bond, may be any polymer that has a carbon-carbon double bond and further has viscosity. As such a base polymer, a polymer having an acrylic polymer as a basic skeleton is preferable. Examples of the basic skeleton of the acrylic polymer include the acrylic polymers exemplified above.

The method for introducing a carbon-carbon double bond into any one of the above-mentioned acrylic polymers is not particularly limited, and may be selected from various methods. The introduction of the carbon-carbon double bond into a side chain of the polymer is easier in molecule design. The method is, for example, a method of copolymerizing a monomer having a functional group with an acrylic polymer, and then causing the resultant to condensation-react or addition-react with a compound having a functional group reactive with the above-mentioned functional group and a carbon-carbon double bond while keeping the ultraviolet ray curability of the carbon-carbon double bond.

Examples of the combination of these functional groups include a carboxylic acid group and an epoxy group; a carboxylic acid group and an aziridine group; and a hydroxyl group and an isocyanate group. Of these combinations, the combination of a hydroxyl group and an isocyanate group is preferable from the viewpoint of the easiness of reaction tracing. If the above-mentioned acrylic polymer, which has a carbon-carbon double bond, can be produced by the combination of these functional groups, each of the functional groups may be present on any one of the acrylic polymer and the above-mentioned compound. It is preferable for the above-mentioned preferable combination that the acrylic polymer has the hydroxyl group and the above-mentioned compound has the isocyanate group. Examples of the isocyanate compound in this case, which has a carbon-carbon double bond, include methacryloyl isocyanate, 2-methacryloyloxyethyl isocyanate, and m-isopropenyl-α,α-dimethylbenzyl isocyanate. The used acrylic polymer may be an acrylic polymer copolymerized with anyone of the hydroxyl-containing monomers exemplified above, or an ether compound such as 2-hydroxyethyl vinyl ether, 4-hydroxybutyl vinyl ether or diethylene glycol monovinyl ether.

The intrinsic type radiation curing type adhesive may be made only of the above-mentioned base polymer (in particular, the acrylic polymer), which has a carbon-carbon double bond. However, the above-mentioned radiation curing type monomer component or oligomer component may be incorporated into the base polymer to such an extent that properties of the adhesive are not deteriorated. The amount of the radiation curing type oligomer component or the like is usually 30 parts or less by weight, preferably from 0 to 10 parts by weight for 100 parts by weight of the base polymer.

In the case that the radiation curing type adhesive is cured with ultraviolet rays or the like, a photopolymerization initiator is incorporated into the adhesive. Examples of the photopolymerization initiator include α-ketol compounds such as 4-(2-hydroxyethoxy)phenyl(2-hydroxy-2-propyl)ketone, α-hydroxy-α,α'-dimethylacetophenone, 2-methyl-2-hydroxypropiophenone, and 1-hydroxycyclohexyl phenyl ketone; acetophenone compounds such as methoxyacetophenone, 2,2-dimethoxy-2-phenylacetophenone, 2,2-diethoxyacetophenone, and 2-methyl-1-[4-(methylthio)-phenyl]-2-morpholinopropane-1; benzoin ether compounds such as benzoin ethyl ether, benzoin isopropyl ether, and anisoin methyl ether; ketal compounds such as benzyl dimethyl ketal; aromatic sulfonyl chloride compounds such as 2-naphthalenesulfonyl chloride; optically active oxime compounds such as 1-phenone-1,1-propanedione-2-(o-ethoxycarbonyl) oxime; benzophenone compounds such as benzophenone, benzoylbenzoic acid, and 3,3'-dimethyl-4-methoxybenzophenone; thioxanthone compound such as thioxanthone, 2-chlorothioxanthone, 2-methylthioxanthone, 2,4-dimethylthioxanthone, isopropylthioxanthone, 2,4-dichlorothioxanthone, 2,4-diethylthioxanthone, and 2,4-diisopropylthioxanthone; camphorquinone; halogenated ketones; acylphosphonoxides; and acylphosphonates. The amount of the photopolymerization initiator to be blended is, for example, from about 0.05 to 20 parts by weight for 100 parts by weight of the acrylic polymer or the like which constitutes the adhesive as a base polymer.

Examples of the radiation curing type pressure-sensitive adhesive include a rubber pressure-sensitive adhesive and an acrylic pressure-sensitive adhesive, that are disclosed in Japanese Patent Application Laid-Open No. 60-196956, containing an addition-polymerizable compound having two or more unsaturated bonds, a photopolymerizable compound such as alkoxysilane having an epoxy group, and a photopolymerization initiator such as a carbonyl compound, an organic sulfur compound, a peroxide, an amine, or an onium salt compound.

The radiation curing-type pressure-sensitive adhesive layer 2 can contain a compound that is colored by radiation irradiation as necessary. By containing the compound that is colored by radiation irradiation in the pressure-sensitive adhesive layer 2, only a portion irradiated with radiation can be colored. That is, the portion 2a that corresponds to the workpiece pasting portion shown in FIG. 2 can be colored. Therefore, whether the pressure-sensitive adhesive layer 2 is irradiated with radiation or not can be visually determined right away, and the workpiece pasting portion can be recognized easily, and the pasting of the workpiece is easy. Further, when detecting a semiconductor element with a photosensor or the like, the detection accuracy improves, and no false operation occurs during pickup of the semiconductor element.

The compound that colors by radiation irradiation is colorless or has a pale color before the irradiation. However, it is colored by irradiation with radiation. A preferred specific example of the compound is a leuco dye. Common leuco dyes such as triphenylmethane, fluoran, phenothiazine, auramine, and spiropyran dyes can be preferably used. Specific examples thereof include 3-[N-(p-tolylamino)]-7-anilinofluoran, 3-[N-(p-tolyl)-N-methylamino]-7-anilinofluoran, 3-[N-(p-tolyl)-N-ethylamino]-7-anilinofluoran, 3-diethylamino-6-methyl-7-anilinofluoran, crystal violet lactone, 4,4',4"-trisdimethylaminotriphenylmethanol, and 4,4',4"-trisdimethylaminotriphenylmethane.

Examples of a developer that is preferably used with these leuco dyes include a prepolymer of a conventionally known phenolformalin resin, an aromatic carboxylic acid derivative, and an electron acceptor such as activated white earth, and various color developers can be used in combination for changing the color tone.

The compound that colors by irradiation with radiation may be included in the radiation curing-type pressure-sensitive adhesive after being dissolved in an organic solvent or the like, or may be included in the pressure-sensitive adhesive in the form of a fine powder. The ratio of use of this compound is 10% by weight or less, preferably 0.01 to 10% by weight, and more preferably 0.5 to 5% by weight in the pressure-sensitive adhesive layer 2. When the ratio of the compound exceeds 10% by weight, the curing of the portion 2a of the pressure-sensitive adhesive layer 2 becomes insufficient because the radiation onto the pressure-sensitive adhesive layer 2 is absorbed too much by this compound, and the adhesive strength may not reduce sufficiently. On the other hand, the ratio of the compound is preferably 0.01% by weight or more to color the compound sufficiently.

When forming the pressure-sensitive adhesive layer 2 with the radiation curing type adhesive, a portion of the pressure-sensitive adhesive layer 2 may be irradiated with radiation so that the adhesive power of the portion 2a in the pressure-sensitive adhesive layer 2 becomes smaller than that of the different portion 2b.

An example of the method of forming the portion 2a on the pressure-sensitive adhesive layer 2 is a method of forming the radiation curing type pressure-sensitive adhesive layer 2 on the support base 1 and then curing the portion 2a by partially irradiating with radiation. The partial irradiation can be performed through a photo mask having a pattern that corresponds to a portion other than the portion 2a. Another example is a method of curing the portion 2a by irradiating with radiation in spots. The radiation curing type pressure-sensitive adhesive layer 2 can be formed by transferring the layer that is provided on a separator onto the support base 1.

The partial curing with radiation can also be performed on the radiation curing type pressure-sensitive adhesive layer 2 that is provided on the separator.

When forming the pressure-sensitive adhesive layer 2 with the radiation curing type pressure-sensitive adhesive, the portion 2a in which the adhesive power is decreased can be formed by using the support base 1 in which the entire portion or one portion other than the portion that corresponds to the portion 2a of at least one surface of the support base 1 is shielded from light, forming the radiation curing type pressure-sensitive adhesive layer 2, and curing the portion 2a by irradiating the support base 1 and the pressure-sensitive adhesive layer 2 with radiation. The shielding material that serves as a photo mask on the support film can be produced by printing, vapor deposition, or the like. According to such a manufacturing method, the film for a semiconductor device 10 can be efficiently manufactured.

When curing inhibition by oxygen occurs at irradiation with radiation, oxygen (air) is desirably shielded from the surface of the radiation curing type pressure-sensitive adhesive layer 2 by some method. Examples thereof include a method of covering the surface of the pressure-sensitive adhesive layer 2 with a separator and a method of performing irradiation with radiation such as an ultraviolet ray in a nitrogen gas atmosphere.

The thickness of the pressure-sensitive adhesive layer 2 is not especially limited. The thickness is preferably about 1 to 50 μm from the viewpoints of preventing chipping of a chip cut section, compatibility of fixing and holding of the adhesive layer, and the like. The thickness is preferably 2 to 30 μm and further preferably 5 to 25 μm.

Examples of the lamination structure of the die bond film 3 include a structure consisting of only a single layer of the adhesive layer and a multi-layered structure in which an adhesive layer is formed on one surface or both surfaces of a core material. Examples of the core material include a film such as a polyimide film, a polyester film, a polyethylene terephthalate film, a polyethylene naphthalate film, and a polycarbonate film, a resin substrate reinforced with glass fibers and plastic nonwoven fibers, a silicon substrate, and a glass substrate.

An example of the adhesive composition that constitutes the die bond film 3 is an adhesive composition in which a thermoplastic resin and a thermosetting resin are used together.

Examples of the above-mentioned thermosetting resin include phenol resin, amino resin, unsaturated polyester resin, epoxy resin, polyurethane resin, silicone resin, and thermosetting polyimide resin. These resins may be used alone or in combination of two or more thereof. Particularly preferable is epoxy resin, which contains ionic impurities which corrode semiconductor elements in only a small amount. As the curing agent of the epoxy resin, phenol resin is preferable.

The epoxy resin may be any epoxy resin that is ordinarily used as an adhesive composition. Examples thereof include bifunctional or polyfunctional epoxy resins such as bisphenol A type, bisphenol F type, bisphenol S type, brominated bisphenol A type, hydrogenated bisphenol A type, bisphenol AF type, biphenyl type, naphthalene type, fluorene type, phenol Novolak type, orthocresol Novolak type, tris-hydroxyphenylmethane type, and tetraphenylolethane type epoxy resins; hydantoin type epoxy resins; tris-glycicylisocyanurate type epoxy resins; and glycidylamine type epoxy resins. These may be used alone or in combination of two or more thereof. Among these epoxy resins, particularly preferable are Novolak type epoxy resin, biphenyl type epoxy resin, tris-hydroxyphenylmethane type epoxy resin, and tetraphenylolethane type epoxy resin, since these epoxy resins are rich in reactivity with phenol resin as an agent for curing the epoxy resin and are superior in heat resistance and so on.

The phenol resin is a resin acting as a curing agent for the epoxy resin. Examples thereof include Novolak type phenol resins such as phenol Novolak resin, phenol aralkyl resin, cresol Novolak resin, tert-butylphenol Novolak resin, phenol biphenyl resin and nonylphenol Novolak resin; resol type phenol resins; and polyoxystyrenes such as poly(p-oxystyrene). These may be used alone or in combination of two or more thereof. Among these phenol resins, phenol Novolak resin and phenol aralkyl resin are particularly preferable, since the connection reliability of the semiconductor device can be improved.

About the blend ratio between the epoxy resin and the phenol resin, for example, the phenol resin is blended with the epoxy resin in such a manner that the hydroxyl groups in the phenol resin is preferably from 0.5 to 2.0 equivalents, more preferably from 0.8 to 1.2 equivalents per equivalent of the epoxy groups in the epoxy resin component. If the blend ratio between the two is out of the range, curing reaction therebetween does not advance sufficiently so that properties of the cured epoxy resin easily deteriorate.

Examples of the thermoplastic resin include natural rubber, butyl rubber, isoprene rubber, chloroprene rubber, ethylene/vinyl acetate copolymer, ethylene/acrylic acid copolymer, ethylene/acrylic ester copolymer, polybutadiene resin, polycarbonate resin, thermoplastic polyimide resin, polyamide resins such as 6-nylon and 6,6-nylon, phenoxy resin, acrylic resin, saturated polyester resins such as PET and PBT, polyamideimide resin, and fluorine-contained resin. These thermoplastic resins may be used alone or in combination of two or more thereof. Of these thermoplastic resins, acrylic resin is particularly preferable since the resin contains ionic impurities in only a small amount and has a high heat resistance so as to make it possible to ensure the reliability of the semiconductor element.

The acrylic resin is not limited to any especial kind, and may be, for example, a polymer comprising, as a component or components, one or more esters of acrylic acid or methacrylic acid having a linear or branched alkyl group having 30 or less carbon atoms, in particular, 4 to 18 carbon atoms. Examples of the alkyl group include methyl, ethyl, propyl, isopropyl, n-butyl, t-butyl, isobutyl, amyl, isoamyl, hexyl, heptyl, cyclohexyl, 2-ethylhexyl, octyl, isooctyl, nonyl, isononyl, decyl, isodecyl, undecyl, lauryl, tridecyl, tetradecyl, stearyl, octadecyl, and dodecyl groups.

A different monomer which constitutes the above-mentioned polymer is not limited to any especial kind, and examples thereof include glycidyl-containing monomers such as glycidyl acrylate and glycidyl methacrylate; carboxyl-containing monomers such as acrylic acid, methacrylic acid, carboxyethyl acrylate, carboxypentyl acrylate, itaconic acid, maleic acid, fumaric acid, and crotonic acid; acid anhydride monomers such as maleic anhydride and itaconic anhydride; hydroxyl-containing monomers such as 2-hydroxyethyl (meth)acrylate, 2-hydroxypropyl (meth)acrylate, 4-hydroxybutyl (meth)acrylate, 6-hydroxyhexyl (meth)acrylate, 8-hydroxyoctyl (meth)acrylate, 10-hydroxydecyl (meth)acrylate, 12-hydroxylauryl (meth)acrylate, and (4-hydroxymethylcyclohexyl)methylacrylate; monomers which contain a sulfonic acid group, such as styrenesulfonic acid, allylsulfonic acid, 2-(meth)acrylamide-2-methylpropanesulfonic acid, (meth)acrylamidepropane sulfonic acid, sulfopropyl (meth)acrylate, and (meth)acryloyloxynaphthalenesulfonic acid; monomers which contain a phosphoric acid group, such as 2-hydroxyethylacryloyl phosphate; styrene monomer; and acrylonitril.

A filler can be appropriately compounded in the die bond film 3 according to the usage. The compounding of a filler enables the provision of electric conductivity, improvement of thermal conductivity, and adjustment of modulus of elasticity. Examples of the filler include inorganic fillers and organic fillers. An inorganic filler is preferable from the viewpoint of characteristics such as improvement of the handling property, improvement of thermal conductivity, adjustment of melt viscosity, and provision of a thixotropic property. The inorganic filler is not especially limited, and examples thereof include aluminum hydroxide, magnesium hydroxide, calcium carbonate, magnesium carbonate, calcium silicate, magnesium silicate, calcium oxide, magnesium oxide, aluminum oxide, aluminum nitride, aluminum borate whisker, boron nitride, crystalline silica, and amorphous silica. These can be used alone or two types or more can be used together. From the viewpoint of improvement of thermal conductivity, aluminum oxide, aluminum nitride, boron nitride, crystalline silica, and amorphous silica are preferable. From the viewpoint of a good balance of the characteristics, crystalline silica and amorphous silica are preferable. Further, a conductive substance (conductive filler) may be used as an inorganic filler for the provision of electric conductivity and improvement of thermal conductivity. Examples of the conductive filler include a metal powder in which silver, aluminum, gold, copper, nickel, or a conductive alloy is made into a sphere, a needle, or a flake; a metal oxide of alumina, and the like, amorphous carbon black, and graphite.

For the amount of the filler to be blended, $Z/(X+Y+Z)$, wherein X is the weight of the thermoplastic component, Y is the weight of the thermosetting component, and Z is the weight of the filler, is preferably 0.05 or more and 0.7 or less, more preferably 0.05 or more and 0.5 or less, and further preferably 0.05 or more and 0.3 or less. By making $Z/(X+Y+Z)$ 0.05 or more and 0.7 or less, the light transmittance of the die bond film can be controlled.

Other additives can be compounded in the die bond film 3 besides the filler as necessary. Examples of other additives include a flame retardant, a silane coupling agent, and an ion trap agent. Examples of the flame retardant include antimony trioxide, antimony pentoxide, and a brominated epoxy resin. These can be used alone or two types or more can be used together. Examples of the silane coupling agent include β-(3,4-epoxycyclohexyl)ethyltrimethoxysilane, γ-glycidoxypropyltrimethoxysilane, and γ-glycidoxypropylmethyldiethoxysilane. These compounds can be used alone or two types or more can be used together. Examples of the ion trap agent include hydrotalcites and bismuth hydroxide. These can be used alone or two types or more can be used together.

The thickness of the die bond film 3 (total thickness in a case of a laminated body) is not especially limited. However, it can be selected from a range of 1 to 200 μm, and is preferably 5 to 100 μm and more preferably 10 to 80 μm.

T shown in the above formula (A) is 4 or more, wherein T1 is the light transmittance at a wavelength of 400 to 800 nm of the portion where the dicing film 11 and the protecting film 14 are laminated and T2 is the light transmittance at a wavelength of 400 to 800 nm of the portion where the dicing film 11, the die bond film 3, and the protecting film 14 are laminated.

To make T 4 or more, the light transmittance of the die bond film 3 is preferably 0.1 to 95%, more preferably 0.1 to 70%, and further preferably 0.1 to 50%. The light transmittance of the die bond film 3 can be controlled by the contents of the epoxy resin, the phenol resin, and the filler.

The protecting film 14 has a function as a protecting material to protect the die bond film 3 until it is put to use. The protecting film 14 can be used as a support base when the die bond film 3 is transferred to the pressure-sensitive adhesive layer 2. The protecting film 14 is peeled when a workpiece is adhered on the die bond film 3. Examples of the material of the protecting film 14 include polyethylene terephthalate (PET), polyethylene, polypropylene, and a plastic film and paper in which the surface is coated with a peeling agent such as a long chain alkylacrylate peeling agent.

Figure 3:
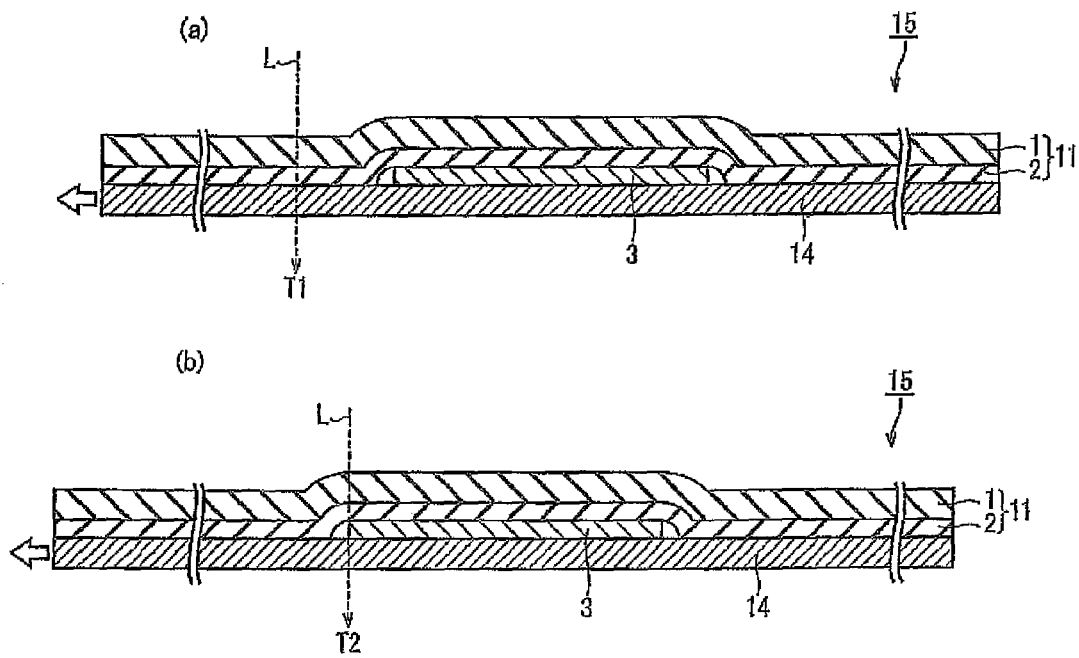
FIGS. 3A and 3B are schematic cross-sectional views for explaining a method of manufacturing the film for a semiconductor device shown in FIGS. 1A and 1B.

In the following, a method of manufacturing the film 10 for a semiconductor device according to the present embodiment is explained. FIGS. 3A and 3B are schematic cross-sectional views for explaining a method of manufacturing the film 10 for a semiconductor device. First, the base 1 is formed with a conventionally known film forming method. Examples of the film forming method include a calendar film forming method, a casting method in an organic solvent, an inflation extrusion method in a closed system, a T die extrusion method, a co-extrusion method, and a dry lamination method.

Then, a coating film is formed by applying a pressure-sensitive adhesive composition solution on the base 1, and then the coating film is dried (cross-linked by heating, if necessary) under a prescribed condition to form the pressure-sensitive adhesive layer 2. The coating method is not especially limited, and examples include roll coating, screen coating, and gravure coating. The drying can be performed under a drying condition of a drying temperature of 80 to 150° C. and a drying time of 0.5 to 5 minutes, for example. Further, a coating film may be formed by applying a pressure-sensitive adhesive composition on a separator, and dried under the drying condition to form the pressure-sensitive adhesive layer 2. After that, the pressure-sensitive adhesive layer 2 is pasted to the base 1 together with the separator, thereby producing the dicing film 11.

The method of manufacturing the die bond film 3 is performed as follows. That is, an adhesive composition solution for forming the die bond film 3 is applied to a base separator to a prescribed thickness to form a coating film. The adhesive composition solution contains the adhesive composition, the filler, and other various additives as described above. After that, the coating film is dried under prescribed conditions to form the die bond film 3. The coating method is not especially limited, and examples thereof include roll coating, screen coating, and gravure coating. The drying conditions can be appropriately set according to the thickness, materials, and the like of the coating film. Specifically, the drying can be performed under conditions of a drying temperature of 70 to 160° C. and a drying time of 1 to 5 minutes, for example.

Then, the die bond films 3 are punched into the shape of a semiconductor wafer to which the die bond films 3 are to be pasted, the die bond films 3 are pasted to the dicing film 11 at prescribed intervals, and further the protecting film 14 is pasted with the die bond film 3 side being a pasting surface. With this operation, the plurality of die bond films 3 are pasted at prescribed intervals between one continuous dicing film 11 and one continuous protecting film 14. One portion of the laminate is magnified and shown in FIG. 3A.

The die bond film 3 can be pasted to the dicing film 11 by pressure-bonding, for example. The laminating temperature is not especially limited, and is normally preferably 30 to 80° C., more preferably 30 to 60° C., and especially preferably 30 to 50° C. The linear pressure is not especially limited, and is normally preferably 0.1 to 20 kgf/cm, and more preferably 1 to 10 kgf/cm.

The cover film 14 is pasted to the die bond film 3 preferably by pressure-bonding. The laminating temperature is not especially limited, and is normally preferably 20 to 80° C., more preferably 20 to 60° C., and especially preferably 20 to 50° C. The linear pressure is not especially limited, and is normally preferably 0.1 to 20 kgf/cm, and more preferably 0.2 to 10 kgf/cm.

The separator is not especially limited, and a conventionally known release-treated film can be used. The materials that constitute the release-treated film are not especially limited, and conventionally known materials can be used. Specific examples thereof include polyethylene terephthalate (PET), polyethylene, polypropylene, and a plastic film and paper whose surface is coated with a separating compound such as a fluorine separating compound or a long chain alkylacrylate separating compound.

A film 15 for a semiconductor device before precut is moved in a fixed direction (to the left in FIG. 3A), and the film 15 for a semiconductor device before precut is irradiated with a light ray L for detecting a film. In FIG. 3A, the light ray L transmits on the portion where the dicing film 11 and the protecting film 14 are laminated, and the transmitted light ray L is detected by a sensor (not shown) to calculate the light transmittance. The light transmittance at this time is the light transmittance T1.

After that, the film 15 for a semiconductor device before precut is moved further. As shown in FIG. 3B, the light ray L transmits on the portion where the dicing film 11, the die bond film 3, and the protecting film 14 are laminated, and the transmitted light ray L is detected by a sensor (not shown) to calculate the light transmittance. The light transmittance at this time is the light transmittance T2.

The wavelength of the light for detecting a film is preferably 400 to 800 nm, more preferably 450 to 750 nm, and further preferably 500 to 700 nm.

When the light transmittance changes to a certain extent or more such that the light transmittance changes from the light transmittance T1 to the light transmittance T2 and T shown in the formula (A) becomes 4 or more, the sensor detects that the position where the light transmittance changes is one end of the die bond film 3. With this operation, the position of the dicing film 11 is detected. Then, the die bond film 3 is punched out so that the die bond film 3 is centered on the dicing film 11 based on the detected position of the dicing film 11. The diameter of the dicing film 11 to be punched out is larger than the diameter of the die bond film 3. With this operation, the film 10 for a semiconductor device is manufactured.

(Method of Manufacturing Semiconductor Device)

Figure 4:
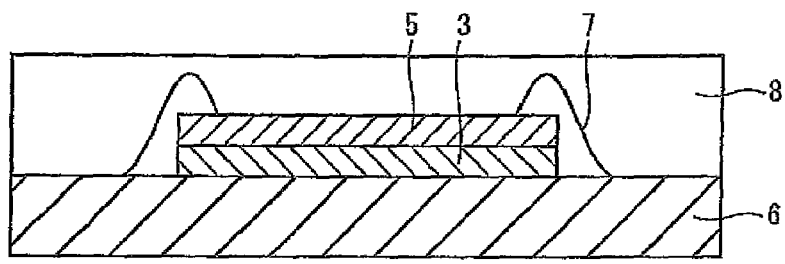
FIG. 4 is a schematic cross-sectional view showing one example of the semiconductor device manufactured using the film for a semiconductor device shown in FIGS. 1A and 1B.

In the following, a method of manufacturing a semiconductor device is explained using a case in which the film 10 for a semiconductor device is used as an example. FIG. 4 is a schematic cross-sectional view showing an example in which a semiconductor chip is mounted with the adhesive layer in the film for a semiconductor device shown in FIGS. 1A and 1B interposed.

First, the dicing film 11 with the die bond film 3 is peeled from the protecting film 14, and the semiconductor wafer 4 is pressure-bonded thereto (a pasting step). This step is performed by pressing with a pressing means such as a pressure roll. The pasting temperature in mounting is not especially limited, and it is preferably in a range of 20 to 80° C., for example.

Next, dicing of the semiconductor wafer 4 is performed. With this operation, a semiconductor chip 5 is manufactured by cutting the semiconductor wafer 4 into an individual piece having a prescribed size. The dicing can be performed according to a normal method from the circuit surface side of the semiconductor wafer 4. A cutting method called full cut in which cutting is performed to the die bond film 3, for example, can be adopted in this step. The dicing apparatus used in this step is not especially limited, and a conventionally known apparatus can be used. Because the semiconductor wafer 4 is adhered and fixed to the dicing film 11 with the die bond film 3, chip cracks and chip fly can be suppressed and damages to the semiconductor wafer 4 can be suppressed.

Then, pickup of the semiconductor chip 5 is performed to peel off the semiconductor chip 5 that is adhered and fixed to the dicing film 11 with the die bond film 3. The method of pickup is not especially limited and various conventionally known methods can be adopted. An example is a method of pushing up the individual semiconductor chip 5 with a needle from the dicing film 11 side and picking up the semiconductor chip 5 that is pushed up with a pickup apparatus.

When the pressure-sensitive adhesive layer 2 is of ultraviolet-ray curing-type, pickup is performed after the pressure-sensitive adhesive layer 2 is irradiated with an ultraviolet ray. With this operation, the adhesive power of the pressure-sensitive adhesive layer 2 to the die bond film 3 decreases, and peeling of the semiconductor chip 5 becomes easy. As a result, pickup becomes possible without damaging the semiconductor chip 5. The conditions of ultraviolet ray irradiation such as the radiation intensity and the radiation time are not especially limited, and they may be set appropriately as necessary. The above-described light source can be used in the ultraviolet ray irradiation.

The semiconductor chip 5 that has been picked up is adhered and fixed to an adherend 6 interposing the die bond film 3 (die bonding). Examples of the adherend 6 include a lead frame, a TAB film, a substrate, and a semiconductor chip that is separately produced. The adherend 6 may be a deformation type adherend that can be easily deformed or a non-deformation type adherend that is difficult to be deformed such as a semiconductor wafer.

Conventionally known substrates can be used as the substrate. A metal lead frame such as a Cu lead frame or a 42 Alloy lead frame, or an organic substrate made of glass epoxy, BT (bismaleimide-triazine), or polyimide can be used as the lead frame. However, the present invention is not limited to these, and includes a circuit board that can be used by mounting the semiconductor element and electrically connecting to the semiconductor element.

When the die bond film 3 is a heat curing type, the semiconductor chip 5 can be adhered and fixed by heat curing to an adherend 6 to improve the heat resistance strength. The heating temperature is 80 to 200° C., preferably 100 to 175° C., and more preferably 100 to 140° C. The heating time is 0.1 to 24 hours, preferably 0.1 to 3 hours, and more preferably 0.2 to 1 hour. The semiconductor chip 5 that is adhered and fixed to a substrate or the like interposing the die bond film 3 can be used in a reflow step.

The shear adhering strength of the die bond film 3 after heat curing to the adherend 6 is preferably 0.2 MPa or more and more preferably 0.2 to 10 MPa. When the shear adhering strength of the die bond film 3 is at least 0.2 MPa or more, shear deformation due to the ultrasonic vibration and heating of a wire bonding step rarely occurs at the adhesion surface of the die bond film 3 and the semiconductor chip 5 or the adherend 6 in the step. That is, a semiconductor element rarely moves by the ultrasonic vibration during wire bonding, and thus a decrease of a success rate of wire bonding can be prevented.

In the method of manufacturing a semiconductor device according to the present embodiment, wire bonding may be performed without the thermal curing step by heat treatment of the die bond film 3, the semiconductor chip 5 may be sealed with a sealing resin, and then after curing of the sealing resin may be performed. In this case, the shear adhering strength of the die bond film 3 during temporary fixing to the adherend 6 is preferably 0.2 MPa or more, and more preferably 0.2 to 10 MPa. When the shear adhering strength of the die bond film 3 during temporary fixing is at least 0.2 MPa or more, shear deformation hardly occurs at the adhering surface of the die bond film 3 and the semiconductor chip 5 or the adherend 6 due to the ultrasonic wave vibration and heating in this step even when the wire bonding step is performed without the heating step. That is, the semiconductor element does not move much by the ultrasonic wave vibration during wire bonding, and accordingly, a decrease of the success rate of wire bonding can be prevented.

The wire bonding is a step of electrically connecting the tip of a terminal part (inner lead) of the adherend 6 and electrode pads (not shown in the drawings) on the semiconductor chip 5 with a bonding wire 7. Examples of the bonding wire 7 include a gold wire, an aluminum wire, and a copper wire. The temperature at wire bonding is 80 to 250° C. and preferably 80 to 220° C. The heating time is a few seconds to a few minutes. The wire bonding is performed by using vibration energy from an ultrasonic wave and pressure-bonding energy from the applied pressure while heating the wire to a temperature in the above-described temperature range. This step may be carried out without thermal curing of the die bond film 3.

The sealing step is a step of sealing the semiconductor chip 5 with a sealing resin 8. This step is performed to protect the semiconductor chip 5 that is mounted on the adherend 6 and the bonding wire 7. This step is performed by molding the resin for sealing with a mold. An example of the sealing resin 8 is an epoxy resin. The heating temperature during resin sealing is normally 175° C. and sealing is performed for 60 to 90 seconds. However, the present invention is not limited to this, and curing can be performed at 165 to 185° C. for a few minutes. With this operation, the sealing resin is cured and the semiconductor chip 5 and the adherend 6 are fixed interposing the die bond film 3. That is, in the present invention, fixing by the die bond film 3 is possible in this step even when the post curing step that is described later is not performed, which can contribute to a reduction of the number of manufacturing steps and a reduction of the manufacturing time of the semiconductor device.

In the post curing step, the sealing resin 8 that is not cured sufficiently in the sealing step is completely cured. Even when t the die bond film 3 is not completely thermally cured in the sealing step, complete thermal curing of the die bond film 3 together with the sealing resin 8 becomes possible in this step. The heating temperature in this step differs according to the type of sealing resin. The temperature is in a range of 165 to 185° C., and the heating time is about 0.5 to 8 hours.

EXAMPLES

Below, preferred examples of the present invention are explained in detail. However, materials, addition amounts, and the like described in these examples are not intended to limit the scope of the present invention, and are only examples for explanation as long as there is no description of limitation in particular. Further, "part" means "parts by weight."

<Production of Die Bond Film>

Manufacturing Example 1

In methylethylketone were dissolved 12 parts of an epoxy resin (Epicoat 1004 manufactured by JER), 13 parts of a phenol resin (Milex XLC-4L manufactured by Mitsui Chemicals, Inc.), 100 parts of an acrylic ester polymer having ethylacrylate-methylmethacrylate as a main component (SG-708-6 manufactured by Nagase ChemteX Corporation), and 30 parts of spherical silica (SO-25R manufactured by Admatechs Co., Ltd.) as a filler to obtain an adhesive composition solution having a concentration of 23.6% by weight.

This adhesive composition solution was applied onto a release-treated film (a release liner) made from polyethylene terephthalate and having a thickness of 50 μm which had been subjected to a silicone releasing treatment, and the resultant was dried at 130° C. for 2 minutes to produced a die bond film A having a thickness of 20 μm.

Manufacturing Example 2

In methylethylketone were dissolved 48 parts of an epoxy resin (Epicoat 1004 manufactured by JER), 51 parts of a phenol resin (Milex XLC-4L manufactured by Mitsui Chemicals, Inc.), 100 parts of an acrylic ester polymer having ethylacrylate-methylmethacrylate as a main component (SG-708-6 manufactured by Nagase ChemteX Corporation), and 74 parts of spherical silica (SO-25R manufactured by Admatechs Co., Ltd.) as a filler to obtain an adhesive composition solution having a concentration of 23.6% by weight.

This adhesive composition solution was applied onto a release-treated film (a release liner) made from polyethylene terephthalate and having a thickness of 50 μm which had been subjected to a silicone releasing treatment, and the resultant was dried at 130° C. for 2 minutes to produced a die bond film B having a thickness of 20 μm.

Manufacturing Example 3

In methylethyl ketone were dissolved 193 parts of an epoxy resin (Epicoat 1004 manufactured by JER), 207 parts of a phenol resin (Milex XLC-4L manufactured by Mitsui Chemicals, Inc.), 100 parts of an acrylic ester polymer having ethylacrylate-methylmethacrylate as a main component (SG-708-6 manufactured by Nagase ChemteX Corporation), and 195 parts of spherical silica (SO-25R manufactured by Admatechs Co., Ltd.) as a filler to obtain an adhesive composition solution having a concentration of 23.6% by weight.

This adhesive composition solution was applied onto a release-treated film (a release liner) made from polyethylene terephthalate and having a thickness of 50 μm which had been subjected to a silicone releasing treatment, and the resultant was dried at 130° C. for 2 minutes to produced a die bond film C having a thickness of 20 μm.

Manufacturing Example 4

In methylethylketone were dissolved 2 parts of an epoxy resin (Epicoat 1004 manufactured by JER), 2 parts of a phenol resin (Milex XLC-4L manufactured by Mitsui Chemicals, Inc.), 100 parts of an acrylic ester polymer having ethylacrylate-methylmethacrylate as a main component (SG-708-6 manufactured by Nagase ChemteX Corporation), and 10 parts of spherical silica (SO-25R manufactured by Admatechs Co., Ltd.) as a filler to obtain an adhesive composition solution having a concentration of 23.6% by weight.

This adhesive composition solution was applied onto a release-treated film (a release liner) made from polyethylene terephthalate and having a thickness of 50 μm which had been subjected to a silicone releasing treatment, and the resultant was dried at 130° C. for 2 minutes to produced a die bond film D having a thickness of 20 μm.

Manufacturing Example 5

In methylethylketone were dissolved 4 parts of an epoxy resin (Epicoat 1004 manufactured by JER), 4 parts of a phenol resin (Milex XLC-4L manufactured by Mitsui Chemicals, Inc.), 100 parts of an acrylic ester polymer having ethylacrylate-methylmethacrylate as a main component (SG-708-6 manufactured by Nagase ChemteX Corporation), and 16 parts of spherical silica (SO-25R manufactured by Admatechs Co., Ltd.) as a filler to obtain an adhesive composition solution having a concentration of 23.6% by weight.

This adhesive composition solution was applied onto a release-treated film (a release liner) made from polyethylene terephthalate and having a thickness of 50 μm which had been subjected to a silicone releasing treatment, and the resultant was dried at 130° C. for 2 minutes to produced a die bond film E having a thickness of 20 μm.

Manufacturing Example 6

In methylethylketone were dissolved 7 parts of an epoxy resin (Epicoat 1004 manufactured by JER), 7 parts of a phenol resin (Milex XLC-4L manufactured by Mitsui Chemicals, Inc.), 100 parts of an acrylic ester polymer having ethylacrylate-methylmethacrylate as a main component (SG-708-6 manufactured by Nagase ChemteX Corporation), and 23 parts of spherical silica (SO-25R manufactured by Admatechs Co., Ltd.) as a filler to obtain an adhesive composition solution having a concentration of 23.6% by weight.

This adhesive composition solution was applied onto a release-treated film (a release liner) made from polyethylene terephthalate and having a thickness of 50 μm which had been subjected to a silicone releasing treatment, and the resultant was dried at 130° C. for 2 minutes to produced a die bond film F having a thickness of 20 μm.

(Measurement of Light Transmittance of Die Bond Film)

The light transmittance of the die bond films A to F produced in Manufacturing Examples 1 to 6 was measured. The measurement method is the same as in the following (Measurement of light transmittance T1 and light transmittance T2). The result is shown in Table 1.

TABLE 1

| | MANU-FACTURING EXAMPLE 1 | MANU-FACTURING EXAMPLE 2 | MANU-FACTURING EXAMPLE 3 | MANU-FACTURING EXAMPLE 4 | MANU-FACTURING EXAMPLE 5 | MANU-FACTURING EXAMPLE 6 |
|---|---|---|---|---|---|---|
| LIGHT TRANSMITTANCE (%) OF DIE BOND FILM | 70 | 45 | 5 | 90 | 80 | 75 |

<Production of Dicing Film>

Manufacturing Example 7

In a reactor having a cooling tube, a nitrogen introducing tube, a thermometer, and a stirrer, 86 parts by weight of 2-ethylhexylacrylate (hereinafter sometimes referred to as "2EHA"), 14 parts by weight of 2-hydroxyethylacrylate (hereinafter sometimes referred to as "HEA"), 0.2 parts by weight of benzoyl peroxide, and 65 parts by weight of toluene were placed, and a polymerization treatment was performed at 61° C. in a nitrogen gas stream for 6 hours to obtain an acryl-based polymer having a weight average molecular weight of 350,000 to 1,000,000. In the acryl-based polymer, 15 parts by weight of 2-methacryloyloxyethylisocyanate (hereinafter sometimes referred to as "MOI") was added, and an addition reaction treatment was performed at 50° C. in an air stream for 48 hours to obtain an acryl-based polymer X.

Next, 8 parts of an isocyanate crosslinking agent (Colonate L manufactured by Nippon Polyurethane Industry Co., Ltd.) and 5 parts of a photo polymerization initiator (Irgacure 651 manufactured by Ciba Specialty Chemicals) relative to 100 parts by weight of the acryl-based polymer X were added to 10 parts by weight of toluene as a solvent to produce a pressure-sensitive adhesive solution. The prepared pressure-sensitive adhesive solution was applied to the surface of a PET release liner having been subjected to a silicone treatment, and was crosslinked by heating at 120° C. for 2 minutes to form a pressure-sensitive adhesive layer precursor having a thickness of 10 μm. Then, a polyolefin film having a thickness of 100 μm was pasted to the surface of the pressure-sensitive adhesive layer precursor. After that, the laminate was preserved at 50° C. for 24 hours. With this operation, a dicing film A was produced.

<Preparation of Protecting Film>

A polyethylene terephthalate film (Diafoil MRA manufactured by Mitsubishi Plastics, Inc.) having a thickness of 38 μm was prepared as the protecting film (hereinafter sometimes referred to as a "protecting film A").

<Production of Film for Semiconductor Device>

Example 1

The dicing film A, the die bond film A, and the protecting film A were used to produce a film for a semiconductor device. In the production of the film for a semiconductor device, a precut apparatus (SRDim-W500 manufactured by SoluTec Co., Ltd.) was used with the setting of 10 m/min. For the sensor, CZ-40 manufactured by KEYENCE Corporation was used at a C+I mode setting. With this operation, a film for a semiconductor device of Example 1 was obtained.

Example 2

A film for a semiconductor device according to Example 2 was produced in the same manner as in Example 1 except that the dicing film A, the die bond film B, and the protecting film A were used.

Example 3

A film for a semiconductor device according to Example 3 was produced in the same manner as in Example 1 except that the dicing film A, the die bond film C, and the protecting film A were used.

Comparative Example 1

A film for a semiconductor device according to Comparative Example 1 was produced in the same manner as in Example 1 except that the dicing film A, the die bond film D, and the protecting film A were used.

Comparative Example 2

A film for a semiconductor device according to Comparative Example 2 was produced in the same manner as in Example 1 except that the dicing film A, the die bond film E, and the protecting film A were used.

Comparative Example 3

A film for a semiconductor device according to Comparative Example 3 was produced in the same manner as in Example 1 except that the dicing film A, the die bond film F, and the protecting film A were used.

(Measurement of Light Transmittance T1 and Light Transmittance T2)

The measurement of the light transmittance T1 of the portion where the dicing film and the protecting film are laminated and the light transmittance T2 of the portion where the dicing film, the die bond film, and the protecting film are laminated was performed using a spectrophotometer (product name: "V-670") manufactured by JASCO Corporation at a measurement mode of % T (transmittance measurement) and a measurement wavelength range of 190 to 800 nm. The transmittance at a wavelength of 650 nm was regarded as the measured value. The result is shown in Table 2. T shown in the formula (A) is also shown in Table 2.

(Confirmation of Yield)

The following confirmation test of the yield was performed using the films for a semiconductor device of the examples and comparative examples.

First, the dicing film with a die bond film was peeled from the protecting film. Next, a semiconductor wafer was pressure-bonded to the die bond film of the dicing film with the die bond film. After that, a dicing ring was pasted thereto. MA-3000 (III) manufactured by Nitto Seiki Co., Ltd. was used in the test under the conditions of 10 mm/sec and 50° C. The test was performed on 100 dicing films with a die bond film, and the number of the films in which the dicing ring was contaminated by the die bond film attached thereto was counted. The result is shown in Table 2. The percentage (yield (%)) of the case where the dicing ring was not contaminated by the die bond film is also shown in Table 2. The evaluation was performed by regarding the case in which contamination of the dicing ring was not confirmed as "○" and regarding the case in which contamination of even one dicing ring was confirmed as "x". The evaluation result is also shown in Table 2. No contamination of the dicing ring means that the semiconductor wafer and the die bond film are pasted to each other without a shift in position.

TABLE 2

| | EXAMPLE 1 | EXAMPLE 2 | EXAMPLE 3 | COMPARATIVE EXAMPLE 1 | COMPARATIVE EXAMPLE 2 | COMPARATIVE EXAMPLE 3 |
|---|---|---|---|---|---|---|
| LIGHT TRANSMITTANCE T1 (%) | 4.44 | 4.44 | 4.44 | 4.44 | 4.44 | 4.44 |

TABLE 2-continued

|  | EXAMPLE 1 | EXAMPLE 2 | EXAMPLE 3 | COMPARATIVE EXAMPLE 1 | COMPARATIVE EXAMPLE 2 | COMPARATIVE EXAMPLE 3 |
|---|---|---|---|---|---|---|
| LIGHT TRANSMITTANCE T2 (%) | 4.25 | 3.99 | 3.10 | 4.42 | 4.39 | 4.30 |
| VALUE OF T | 4 | 10 | 30 | 0.5 | 1 | 3 |
| NUMBER OF CONTAMINATED DICING RING | 0/100 | 0/100 | 0/100 | 56/100 | 18/100 | 4/100 |
| YIELD (%) | 100 | 100 | 100 | 44 | 82 | 96 |
| JUDGMENT OF ACCEPTANCE | ○ | ○ | ○ | X | X | X |

(Result)

By manufacturing and using the films for a semiconductor device of Examples 1 to 3 having a large difference between the light transmittances T1 and T2 and in which the value of T is 4 or more, the contamination of the dicing ring was suppressed when the semiconductor wafer was pasted to the die bond film.

What is claimed is:

1. A method of manufacturing a film for a semiconductor device in which a dicing film, a die bond film, and a protecting film are laminated in this order, wherein T is 4 or more, wherein T is defined as $T=100-((T2/T1)\times 100)$, where T1 is the light transmittance at a wavelength of 400 to 800 nm of a portion where the dicing film and the protecting film are laminated, and T2 is the light transmittance at a wavelength of 400 to 800 nm of a portion where the dicing film, the die bond film, and the protecting film are laminated, the method comprising:
  producing the dicing film,
  producing the die bond film,
  punching the die bond film into the shape of a semiconductor wafer to which the die bond film is to be pasted,
  pasting a plurality of die bond films to the dicing film at prescribed intervals and further pasting the protecting film thereto with the die bond film side being a pasting surface,
  irradiating the die bond film with a light ray having a wavelength of 400 to 800 nm to detect the position of the die bond film based on the obtained T, and
  punching the dicing film out based on the detected position of the die bond film.

2. The method of manufacturing a film for a semiconductor device according to claim 1, wherein the light transmittance T1 is 2 to 80%.

3. The method of manufacturing a film for a semiconductor device according to claim 2, wherein the light transmittance T2 is 0.1 to 70%.

4. The method of manufacturing a film for a semiconductor device according to claim 1, wherein the light transmittance T2 is 0.1 to 70%.

5. The method of manufacturing a film for a semiconductor device according to claim 1, wherein T is 10 to 50.

6. A method of manufacturing a semiconductor device comprising:
  providing a film for a semiconductor device made in accordance with the method of claim 1;
  peeling the die bond film from the protecting film;
  pasting a semiconductor wafer to the die bond film; and
  dicing the semiconductor wafer.

7. The method of manufacturing a semiconductor device according to claim 6, further comprising:
  picking up a semiconductor chip of the diced semiconductor wafer;
  adhering the semiconductor chip to an adherend;
  wire bonding the adhered semiconductor chip; and
  sealing the wire-bonded semiconductor chip with a sealing resin.

* * * * *

UNITED STATES PATENT AND TRADEMARK OFFICE
CERTIFICATE OF CORRECTION

| | | |
|---|---|---|
| PATENT NO. | : 8,658,515 B2 | Page 1 of 1 |
| APPLICATION NO. | : 13/415073 | |
| DATED | : February 25, 2014 | |
| INVENTOR(S) | : Inoue et al. | |

It is certified that error appears in the above-identified patent and that said Letters Patent is hereby corrected as shown below:

In the Specification

In column 4 at line 51, Change "unstreched," to --unstretched,--.

In column 10 at line 63, Change "tris-glycicylisocyanurate" to --tris-glycidylisocyanurate--.

In column 11 at line 67, Change "acrylonitril." to --acrylonitrile.--.

In column 17 at line 8, Change "produced" to --produce--.

In column 17 at line 26, Change "produced" to --produce--.

In column 17 at line 46, Change "produced" to --produce--.

In column 18 at line 11, Change "produced" to --produce--.

In column 18 at line 27, Change "produced" to --produce--.

In column 18 at line 46, Change "produced" to --produce--.

Signed and Sealed this
Twenty-third Day of September, 2014

Michelle K. Lee
*Deputy Director of the United States Patent and Trademark Office*